(12) United States Patent
Bindseil et al.

(10) Patent No.: US 11,314,671 B2
(45) Date of Patent: Apr. 26, 2022

(54) CIRCUIT COMPRISING A CURRENT OUTPUT DRIVER FOR OUTPUTTING AN OUTPUT CURRENT TO A LOAD

(71) Applicant: WAGO Verwaltungsgesellschaft mbH, Minden (DE)

(72) Inventors: Walter Bindseil, Bielefeld (DE); Sebastian Schulze, Hattingen (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 17/102,016

(22) Filed: Nov. 23, 2020

(65) Prior Publication Data

US 2021/0157752 A1    May 27, 2021

(30) Foreign Application Priority Data

Nov. 21, 2019    (DE) .................... 20 2019 106 469.2

(51) Int. Cl.
*G06F 13/20* (2006.01)
*H03M 1/66* (2006.01)

(52) U.S. Cl.
CPC .......... *G06F 13/20* (2013.01); *G06F 2213/40* (2013.01); *H03M 1/66* (2013.01)

(58) Field of Classification Search
CPC ................. G06F 13/20; G06F 2213/40; G05B 2219/21137; G08C 19/02
See application file for complete search history.

(56) References Cited

U.S. PATENT DOCUMENTS

| 9,225,244 B2 | 12/2015 | Brudermann et al. |
| 2014/0197760 A1* | 7/2014 | Radermacher ..... H05B 45/3725 315/307 |
| 2015/0280652 A1* | 10/2015 | Cohen .................. H03F 1/0227 330/297 |
| 2017/0099011 A1* | 4/2017 | Freeman ................. H02M 1/32 |
| 2021/0013848 A1* | 1/2021 | Waldmeier ............ H04B 3/542 |

FOREIGN PATENT DOCUMENTS

DE      102012200105 A1    7/2013

* cited by examiner

*Primary Examiner* — Raymond N Phan
(74) *Attorney, Agent, or Firm* — Muncy, Geissler, Olds & Lowe, P.C.

(57) ABSTRACT

A circuit for an I/O module, the circuit having a communication unit for receiving process data, which is connectable to a bus for communication purposes, a microcontroller which is connected to the communication unit, a load, a digital/analog converter, which includes a current output driver for outputting an output current to the load, and a first DC/DC converter. The microcontroller is connected to the digital/analog converter via a digital interface and is configured to set the output current of the digital/analog converter via the digital interface based on the received process data. The microcontroller is configured to output a control signal to a first DC/DC converter via the control interface for setting the first supply voltage based on the output current and the digital voltage value.

17 Claims, 7 Drawing Sheets

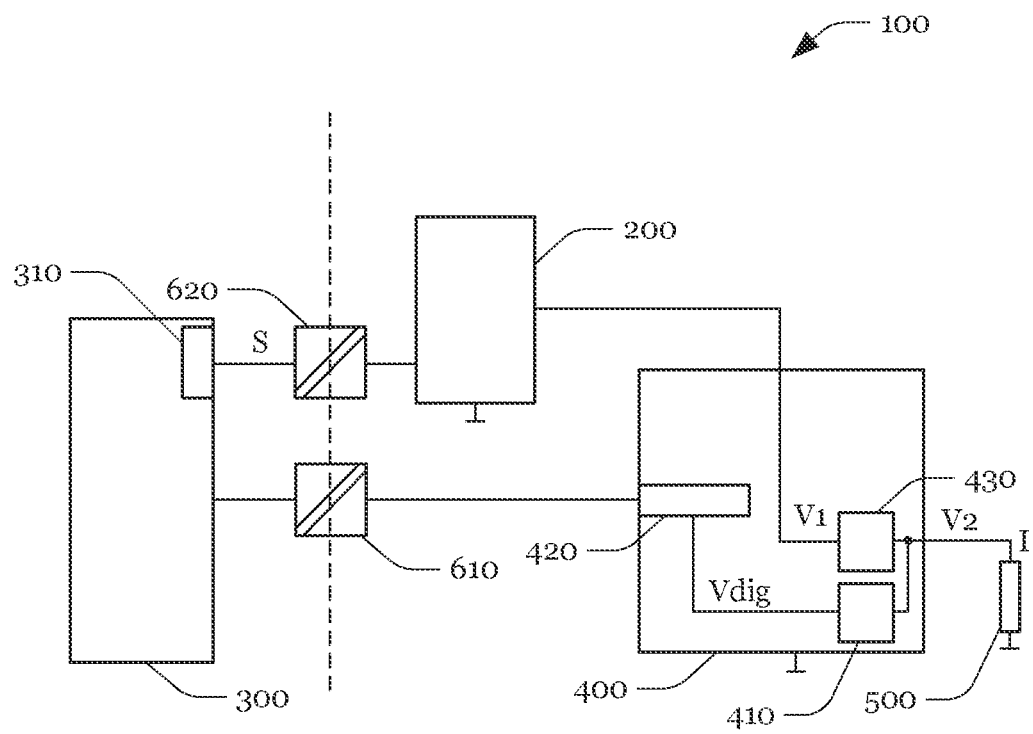
Fig. 2
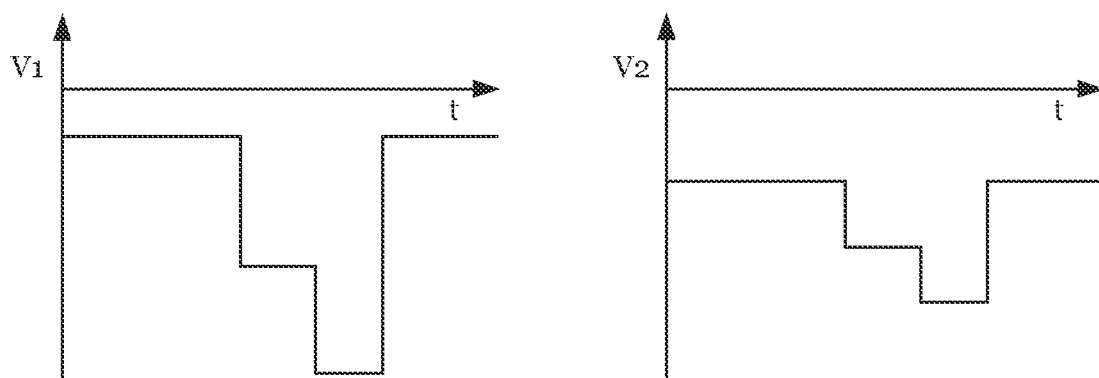
Fig. 2a                    Fig. 2b

CIRCUIT COMPRISING A CURRENT OUTPUT DRIVER FOR OUTPUTTING AN OUTPUT CURRENT TO A LOAD

This non-provisional application claims priority under 35 U.S.C. § 119(a) to German Patent Application No. 20 2019 106 469.2, which was filed in Germany on Nov. 21, 2019, and which is herein incorporated by reference.

BACKGROUND OF THE INVENTION

Field of the Invention

The present invention relates to a circuit for an input/output module (I/O module) comprising a microcontroller and a digital/analog converter, which includes a current output driver for outputting an output current to a load. In particular, the present invention relates to a circuit for an I/O module comprising a microcontroller, which measures the output voltage and adapts a supply voltage of the digital/analog converter to reduce the power loss, based on the measured output voltage.

Description of the Background Art

The power loss of an analog current output module is essentially determined by the current output driver and its supply circuit. To reduce the power loss, the supply voltage may be regulated continuously as a function of the output voltage. For example, if only a relatively low output voltage flows, the supply voltage of the current output driver may be reduced. As a result, a lower voltage drops at the current output driver, and the current supply circuit must supply a lower power. The power loss of the current output driver and the current supply circuit thus decreases as a whole.

SUMMARY OF THE INVENTION

It is therefore an object of the present invention to provide a circuit that comprises a communication unit for receiving process data, which is connectable to a bus for communication purposes, a microcontroller, which is connected to the communication unit, a load, a digital/analog converter, which includes a current output driver for outputting an output current to the load, and a first DC/DC converter. The microcontroller is connected to the digital/analog converter via a digital interface and is configured to set the output current of the digital/analog converter via the digital interface, based on the received process data.

The digital/analog converter includes an analog/digital converter and is configured to convert an output voltage into a digital voltage value with the aid of the analog/digital converter and to transmit it to the microcontroller via the digital interface. The microcontroller is connected to the first DC/DC converter via a control interface, the first DC/DC converter being configured to generate a first supply voltage for supplying the current output driver of the digital/analog converter. The microcontroller is configured to output a control signal to the first DC/DC converter via the control interface for setting the first supply voltage, based on the output current and the digital voltage value.

The term "circuit," can be understood to be, for example, an assembly of electrical and/or electronic components to form a functional arrangement. In addition, the term "microcontroller," can be understood to be, for example, a semiconductor chip comprising a processor and a memory. Furthermore, the term "digital/analog converter," can be understood to be, for example, a circuit which receives, for example, a binary-coded piece of information and derives a voltage to be output or an intensity of a current to be output from the binary-coded information.

The term "current output driver," can be understood to be, for example, a circuit which outputs a current at an output and which is derived from the voltage present on the input side. In addition, the term "DC/DC converter," can be understood to be, for example, a circuit which is supplied with a first voltage on the input side and outputs a second voltage on the output side, the input-side voltage and the output-side voltage differing from each other at least in sections. Furthermore, the term "digital interface," can be understood to be, for example, an interface which transmits a binary-coded piece of information from a microcontroller, for example, to a digital/analog converter and vice versa.

Moreover, the term "analog/digital converter," can be understood to be, for example, a circuit which derives a binary-coded piece of information, for example from an input voltage or an intensity of an input current. The term "digital voltage value," can be understood to be, for example, a voltage value which is interpreted in that the voltage value is compared with value ranges and assigned to the value range in which it lies.

The term "I/O module," can be understood to be, for example, a device connected in series to a further I/O module or a head station or connected in series during operation, which connects one or multiple field devices to the head station and possibly to a higher-level control unit (via the head station). In this context, the term "field device," can be understood to be, for example, sensors and/or actuators connected (via signals) to the I/O module (e.g. connected at the I/O module).

Furthermore, the term "input" and the term "output," can be understood to be, for example, an electrical connection such as a connecting terminal. Moreover, the term "head station," can be understood to be, for example, a component of a modular field bus node, whose task is to make the data and/or the services of the I/O modules connected in series to the head station available to additional field bus users (such as the higher-level control unit) via a bus interface and a field bus connected to the bus interface.

The microcontroller may be configured to store an output range having a minimum current value and a maximum current value received via the communication unit and to set the first supply voltage based on the minimum current value and/or the maximum current value.

The microcontroller may also be configured to initially set the first supply voltage to a maximum voltage value and, after the process data is received, to set the first supply voltage based on the output current and the digital voltage value.

The microcontroller may be further configured to set the first supply voltage based on the output current if the output current contained in the process data is within a predetermined current range.

The microcontroller may also be configured to set the first supply voltage based on the output current if the digital voltage value is within a predetermined voltage value range.

The microcontroller may be configured to set the first supply voltage based on a function, the function including the maximum current value and the output current and the digital voltage value as input variables.

The microcontroller may be further configured to set the first supply voltage additionally based on an offset voltage.

The microcontroller may be configured, for example, to set the first supply voltage based on a function as follows:

$$V1 = Imax * Vdig/I + Voff$$

wherein Imax is the maximum current value, V1 is the first supply voltage, Vdig is the digital voltage value, I is the output current and Voff is an offset voltage.

The microcontroller may be further configured to adapt the offset voltage as a function of time values and/or measured values.

The microcontroller may be configured to determine a control signal multiple times for setting the first supply voltage and to output it to the first DC/DC converter via the control interface, the determinations taking place during two (different) measurements of the supply voltages spaced apart in time.

The microcontroller may also be configured to redetermine the first supply voltage of the first DC/SC converter upon activating the circuit.

The microcontroller may further be configured to generate a control signal, with the aid of which the first DC/DC converter is controlled.

For example, the microcontroller may be configured to set the first supply voltage by means of pulse width modulation (PWM) of the control signal, or the switching signal may correspond to a percentage value, from which a PWM signal or an analog signal corresponding to the percentage value may be derived.

The calculation of the switching signal or the percentage value may be determined by the microcontroller, based on the current value of the output current (which is, for example, already present in the microcontroller in digital form) and the digital voltage value (which is, for example, transmitted to the microcontroller with the aid of an SPI). If the load behaves like an ohmic resistor (i.e. linearly), one base point (made up of a current value and an associated digital voltage value) is sufficient. In the case of a non-linear resistor, multiple base points may be detected, and the switching signal or the percentage value may be extrapolated.

A memory of the microcontroller may have a data structure which assigns the first supply voltage to a pulse width.

The circuit may comprise a second DC/DC converter, which is supplied with a second supply voltage, the second DC/DC converter being integrated into the digital/analog converter and configured to generate a third supply voltage of the current output driver, and the microcontroller being configured to set the third supply voltage on the basis of the voltage at the current output and the output current via the digital interface.

The first and third supply voltages may have different signs. For example, the first supply voltage may be a negative voltage, and the third supply voltage may be a positive voltage.

The microcontroller and the first DC/DC converter may be galvanically isolated.

The microcontroller and the current output driver may be galvanically isolated.

The microcontroller may be configured to receive process data via a bus interface and to derive current values to be output at the current output from the process data.

It is understood that the steps carried out by the circuit may be understood as steps of a corresponding method, which is implemented using the circuit, and vice versa.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 2 shows a modification of the circuit according to the invention illustrated in FIG. 1;

FIG. 2a and FIG. 2b show the first supply voltage and the output voltage in FIG. 2;

DETAILED DESCRIPTION

Figure 1:
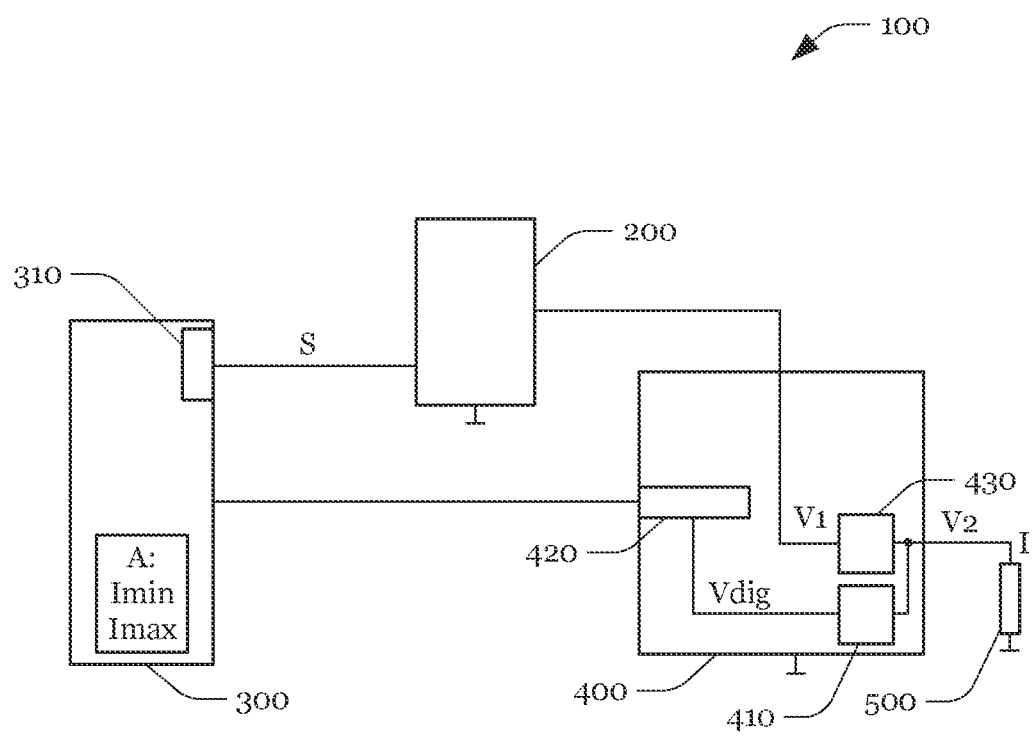
FIG. 1 shows a block diagram of a circuit according to the invention.

FIG. 1 shows a circuit 100 comprising a microcontroller 300 and a digital/analog converter 400. Digital/analog converter 400 includes a current output driver 430 for outputting an output current to a load 500. Microcontroller 300 is connected to digital/analog converter 400 via a digital interface 420 and sets output current I of digital/analog converter 400 via this interface. Digital/analog converter 400 includes an analog/digital converter 410 and, with the aid of analog/digital converter 410, converts output voltage V2 into a digital voltage value Vdig, which is transmitted to microcontroller 300 via digital interface 420.

Circuit 100 further comprises a first DC/DC converter 200, which generates first supply voltage V1 for supplying current output driver 430 of digital/analog converter 400. Microcontroller 300 is connected to first DC/DC converter 200 via control interface 310 and derives a control signal S from output current I and digital voltage value Vdig, which is output to first DC/DC converter 200 via control interface 310 for the purpose of setting first supply voltage V1.

When microcontroller 300 is started, it transmits a command for outputting a current I to digital/analog converter 400. Output voltage V2 (voltage at resistor RL) may be read back via analog/digital converter 410 and the digital interface (e.g. a serial peripheral interface, SPI) as digital voltage value Vdig. Microcontroller 300 may calculate the value of resistance RL of load 500 (RL=Vdig/I) from measured value Vdig of output voltage V2 and known output current I.

Based on resistance value RL and a (current) output range A having a minimum current value Imin and a maximum current value Imax, first supply voltage V1 may then be set, based on minimum current value Imin and/or maximum current value Imax.

For example, a necessary minimum negative supply voltage V1 may be set at first DC/DC converter 200 via a PWM (e.g. V1=(RL×Imin)−2.5 V)). For this purpose, the memory of microcontroller 300 may have a data structure which assigns first supply voltage V1 to a pulse width. Offset voltage Voff of 2.5 volts may be adapted as a function of time values and/or measured values. For example, this may be advantageous, in particular if a capacitance or an inductance takes effect at the output of circuit 100.

Figures 1A, 1B:
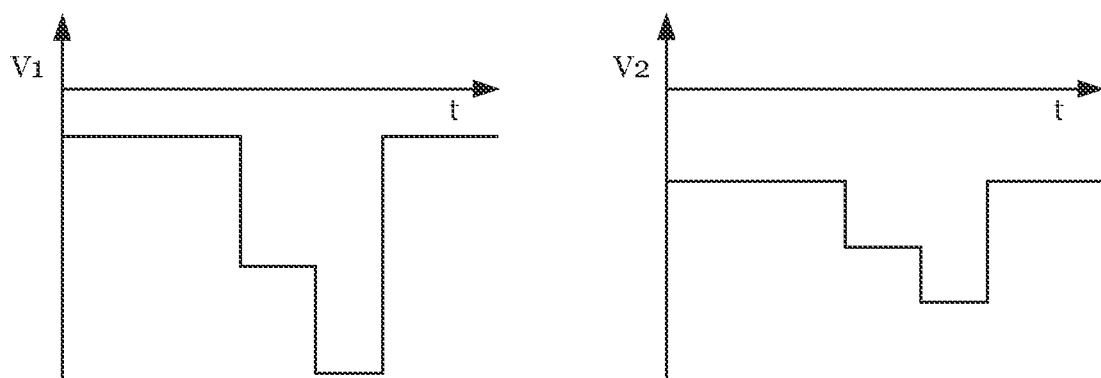
FIG. 1a and FIG. 1b show the first supply voltage and the output voltage in FIG. 1.

It may thus be ensured that set supply voltage V1 is valid for ascertained resistance value RL in the entire current output range A to be used. At the same time the power loss due to lower negative supply voltage V1 is significantly reduced. Since resistance value RL does not change during operation, the calculation and the setting of negative first supply voltage V1 is necessary on a one-time basis only at the startup of microcontroller 300 or after a detected diagnosis or after the change of current output range A. As illustrated in FIG. 1a and FIG. 1b, first supply voltage V1 may be adapted as a function of output voltage V2, so that the power loss may be reduced.

Figure 1C:
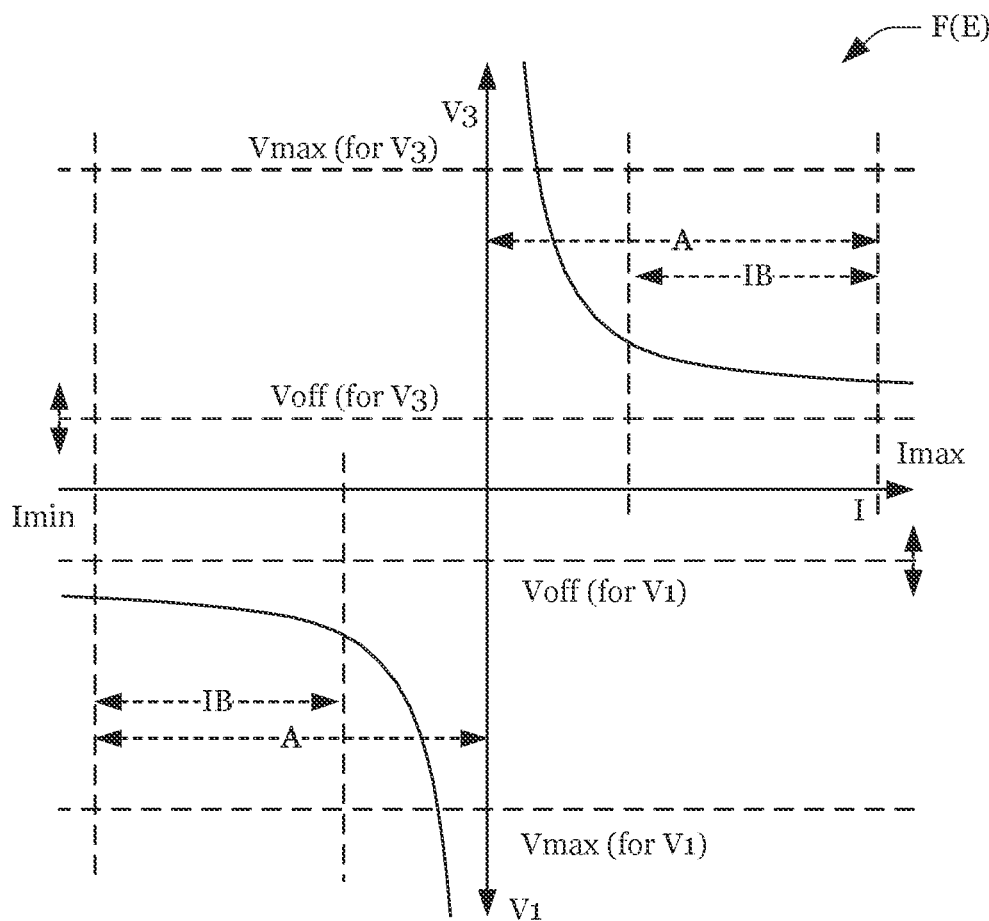
FIG. 1c and FIG. 1d show the determination of the first supply voltage and a possible determination of the third supply voltage.

As illustrated in FIG. 1c, first supply voltage V1 may be initially set to a maximum voltage value Vmax and set as input variable E after the receipt of process data 800 according to a formula F with output current I and digital voltage value Vdig if output current I predefined by process data 800 is within output range A.

Figure 1D:
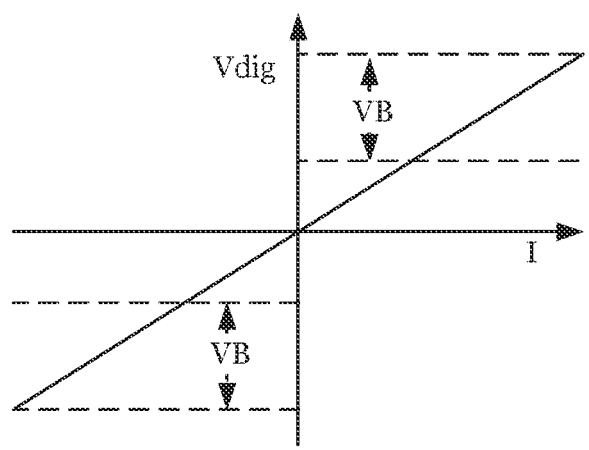

To prevent the setting from being corrupted by an inaccurate digitizing of output voltage V2, it may be provided that first supply voltage V1 is set, based on output current I, only if output current I contained in process data 800 is within a predetermined current range IB or has a minimum value of, for example, >1 mA. Alternatively, it may be provided that, as illustrated in FIG. 1d, first supply voltage V1 is set, based on output current I, only if digital voltage value Vdig is within a predetermined voltage value range VB.

The occurrence of a (long-term) change in resistance RL of load 500 (which is brought about, for example, by the aging of the components) may be compensated for in that, for the purpose of setting first supply voltage V1, control signal S is adapted after the expiry of a certain period of time, based on the then present output voltage V2, and adapted control signal S is output to first DC/DC converter 200 via control interface 310, and more recent control signal S thus replaces older control signal S.

As illustrated in FIG. 2, FIG. 2a and FIG. 2b, microcontroller 300 and first DC/DC converter 200 may be galvanically isolated. In addition, microcontroller 300 and current output driver 430 may be galvanically isolated.

Figure 3:
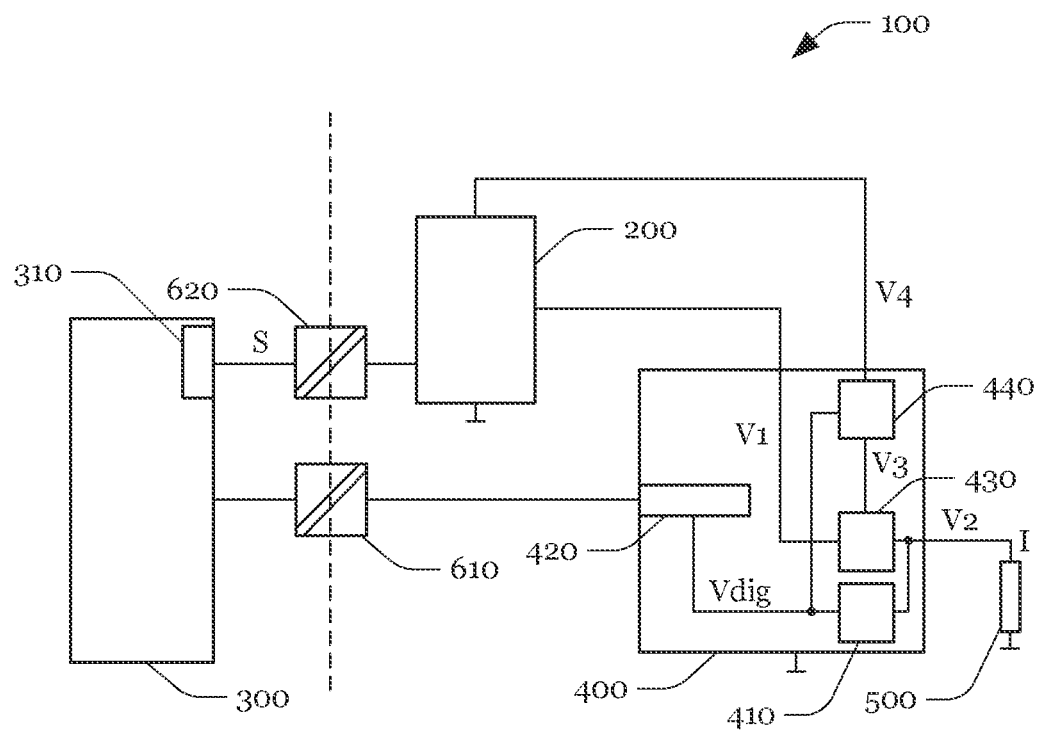
FIG. 3 shows a modification of the circuit according to the invention illustrated in FIG. 2.
Figure 3A:
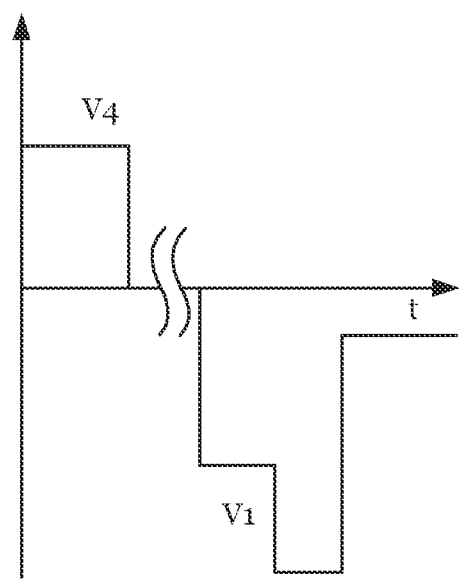
FIG. 3a and FIG. 3b show the first supply voltage, the third supply voltage and the output voltage in FIG. 3.
Figure 3B:
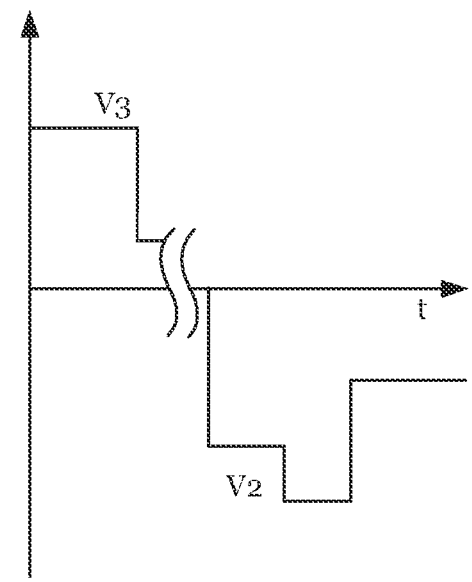

As illustrated in FIG. 3, circuit 100 may comprise a second DC/DC converter 440, which is supplied with a second supply voltage V4. Second DC/DC converter 440 may be integrated into digital/analog converter 400 and generate a third supply voltage V3 of current output driver 430. Microcontroller 300 may set third supply voltage V3 via digital interface 420 based on output voltage V2 of output current I. As illustrated in FIG. 3a and FIG. 3b, first supply voltage V1 may be a negative voltage, and third supply voltage V3 may be a positive voltage. For example, load 500 may be exchanged with another load 500 in a period of disuse, which does not require a positive output current I but rather a negative output current I.

Figure 4:
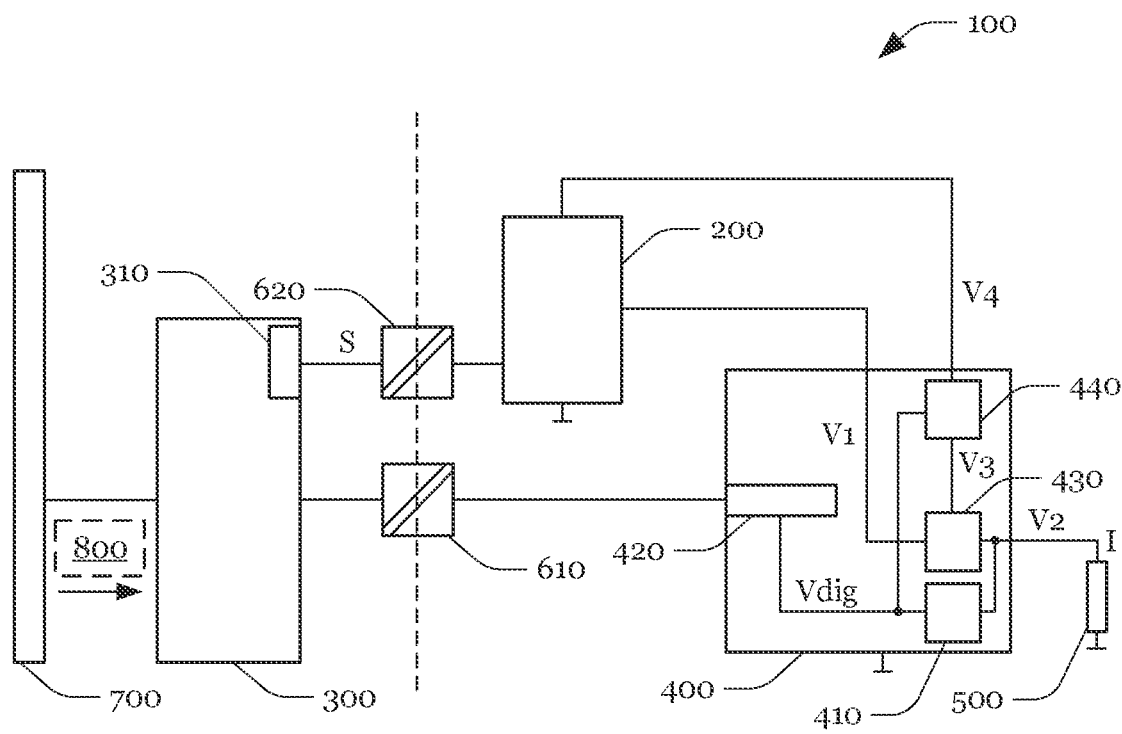
FIG. 4 shows a modification of the circuit according to the invention illustrated in FIG. 3.
Figure 4A:
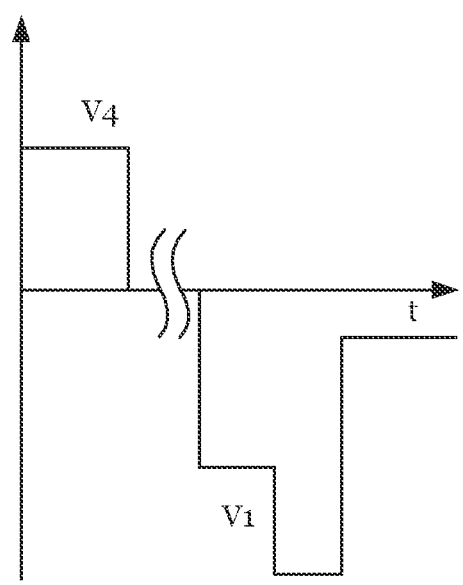
FIG. 4a and FIG. 4b show the first supply voltage, third supply voltage and the output voltage in FIG. 4.
Figure 4B:
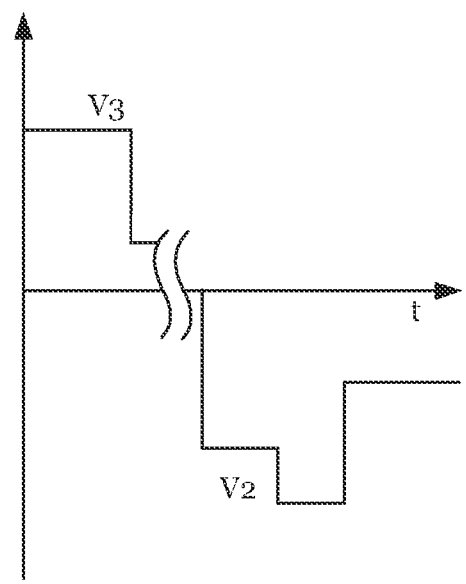

As illustrated in FIG. 4, microcontroller 300 may be configured to receive process data 800 via a communication unit (700) (e.g. a bus interface) and to derive current values to be output at current output from process data 800.

Figure 5:
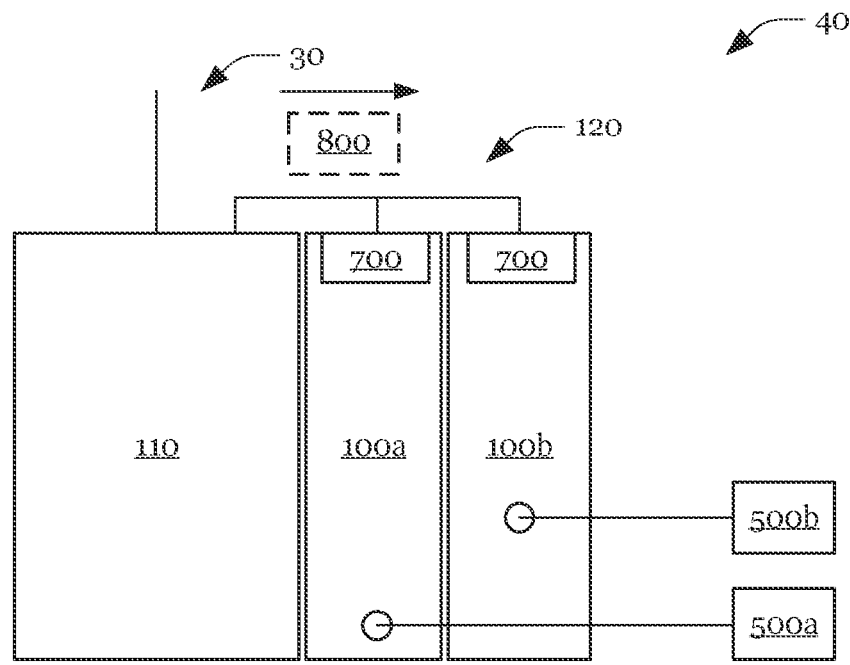
FIG. 5 shows the structure of a modular field bus node, in which the circuit may be used.

FIG. 5 shows an example of a modular field bus node 40, including a head station 110 and two modules 100a, 100b connected in series to head station 110, to which a sensor 500a or an actuator 500b is connected. Sensor 500a and/or actuator 500b may be individually supplied with a corresponding output voltage V2 via a circuit 100 provided in particular module 100a, 100b. It is understood that modules 100a, 100b may be modified in such a way that a large number of sensors 500a and/or actuators 500b may be connected thereto, one or multiple of sensors 500a and/or actuators 500b being individually suppliable with an output voltage V2 adapted in each case via corresponding circuits 100.

Figure 6:
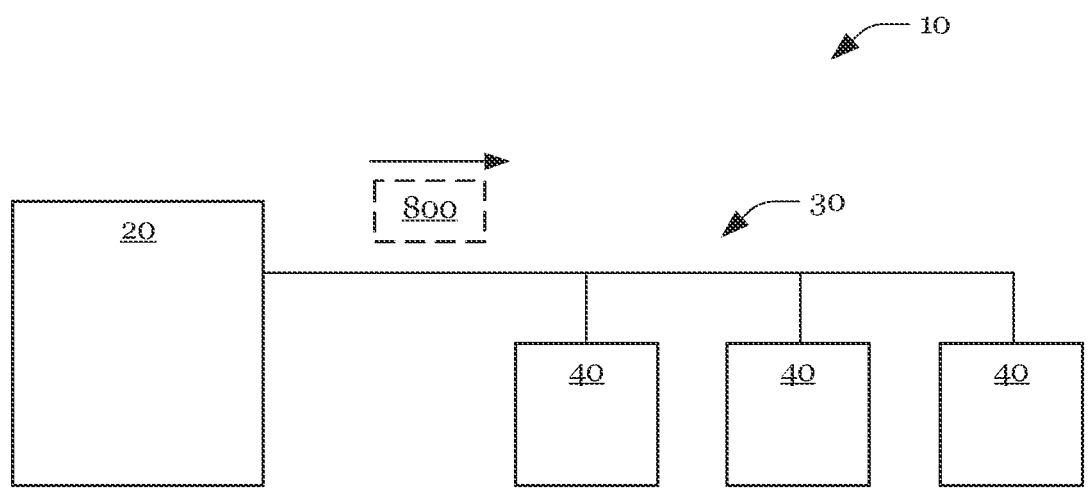
FIG. 6 schematically shows the structure of a field bus system.

During operation, module 100a, which supplies sensor 500a with output voltage V2, reads in sensor signals via a separate signal line and generates status data from the sensor signals, which is transmitted to head station 110 via local bus 120. Head station 110 may locally process the status data and/or forward it (possibly in modified form) to a higher-level unit 20 via a field bus 30, if modular field bus node 40 is part of a field bus system 10, as illustrated in FIG. 6. Higher-level unit 20 (or head station 110 in the case of local processing) may then generate control data, taking the status data into account.

Field bus system 10 includes a large number of field bus nodes 40, which are connected to higher-level unit 20 via a (field) bus 30. Higher-level unit 20 may be used to monitor as well as to regulate a system (not illustrated), which is monitored or controlled by field bus system 10. If higher-level unit 20 monitors a system, higher-level unit 20 may receive status data (hereinafter referred to as input process representation) from field bus node 40 cyclically or acyclically, which describes the status of the system and generates an error signal or an alarm signal when the status of the system (substantially) deviates from a desired/permitted status or status range. If higher-level unit 20 (not only monitors but also) regulates the system, higher-level unit 20 may receive status data from field bus node 40 cyclically or acyclically and ascertain control data transmitted to field bus node 40, taking into account the status data. The control data may be part of the process data.

The control data generated by higher-level unit 20 may be transmitted to (the same) or (another) head station 110 via (field) bus 30. The control data transmitted to head station 110 (or generated by head station 110) may then be forwarded/transmitted to module 100b (possibly in modified form). Module 100b receives the control data and outputs control signals corresponding to the control data to the output to which actuator 500b is connected. The communication of data between the components of field bus system 10 and the mapping of the sensor signals to status data and the mapping of control data to control signals may be adapted to different use scenarios by a configuration of field bus nodes 100a and 100b. Within the scope of the configuration, a minimum current value Imin and a maximum current value Imax may also be transmitted to microcontroller 300, supply voltages V1 and V3 being set, based on minimum current value Imin and/or maximum current value Imax.

Figure 7:
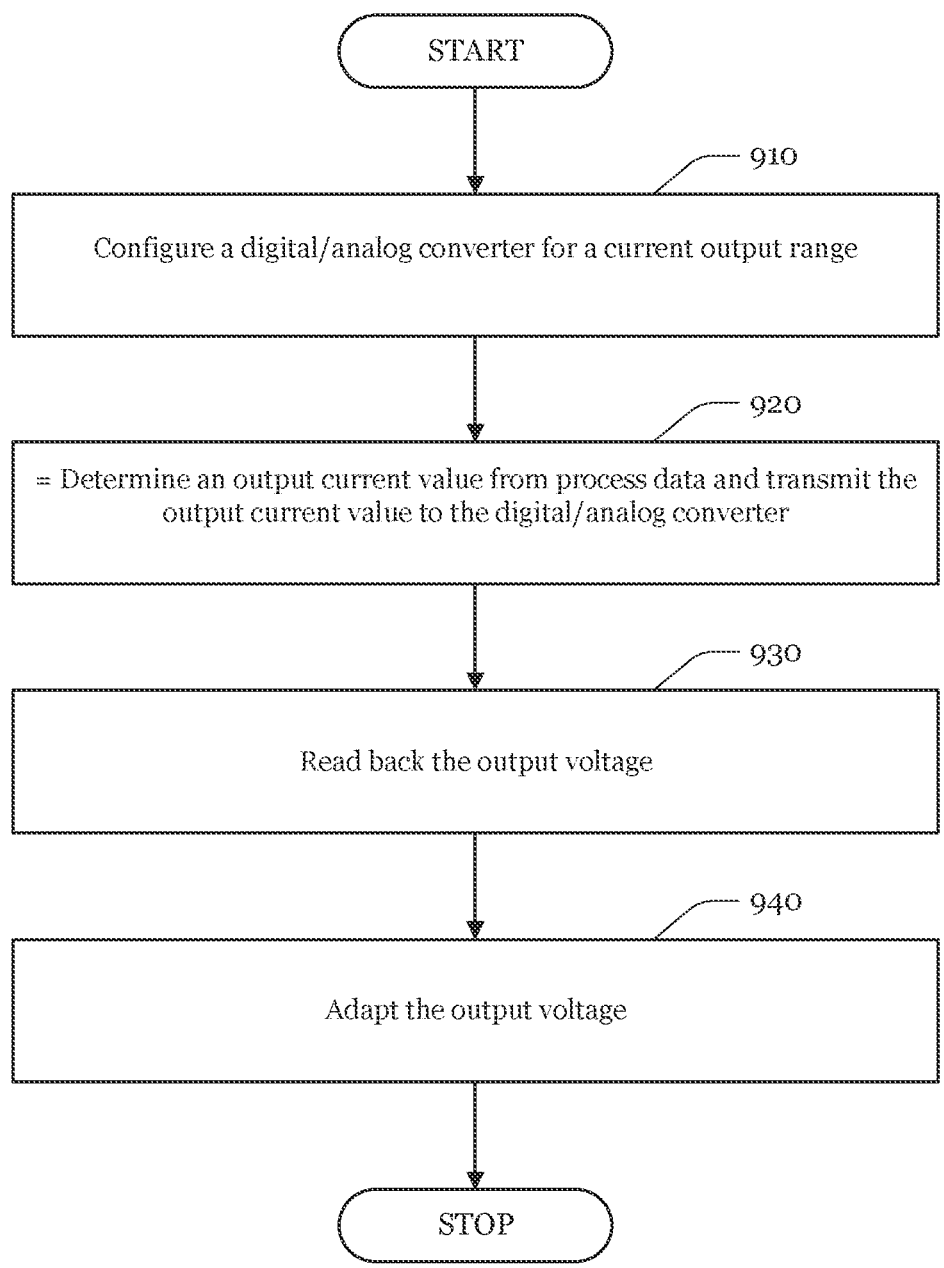
FIG. 7 shows a flowchart, which illustrates the use of the circuit according to the invention.

Likewise, the voltage supply of sensor 500a and actuator 500b may be adapted individually to sensor 50a or actuator 500b by corresponding process data. The sequence is represented as an example in the flowchart in FIG. 7. Once circuit 100 is supplied with energy, an initialization phase is started in step 910, in which digital/analog converter 400 is configured for a current output range (e.g. ±22 mA). In step 920, process data 800 (which predefines, for example, an output current I of −10 mA) is then processed by microcontroller 300, and a corresponding control signal S is sent to digital/analog converter 400 (e.g. via a serial parallel interface, SPI).

Microcontroller 300 subsequently requests output voltage V2 in step 930. For example, if load 500, 500b, 500b generates a resistance of 200Ω2, value V2=10 mA×200 Ω=2 V is measured and transmitted to microcontroller 300 as digital voltage value Vdig. Microcontroller 300 may then carry out a resistance calculation (RL=Vdig/10 mA=200Ω) and determine a necessary negative minimum supply voltage of current output driver 430 (V1=−22 mA×200Ω)−2.5 V=−6.9 V) (current output driver 430 may require, for example, a constant minimum voltage of −2.5 V to be operated within the specified range). The calculated minimum supply voltage (−6.9 V) may be assigned to an empirically ascertained PWM value stored in a table. The aforementioned value (e.g. PWM=7%) may be transmitted to first DC/DC converter 200, whereby first supply voltage V1 is adapted in step 940. This method may also be used to generate a positive third supply voltage V3.

In the above example, the power loss of the current output driver is, for example (6.9 V−(200 Ω×10 mA))×10 mA=49 mW. Without adapting the negative current driver supply, the power loss of the current output driver would be much higher at (16 V−(200 Ω×10 mA))×10 mA=140 mW. The 6.9 V may remain unchanged for the further operation of the resistance value of 200Ω, since the negative supply voltage is set for the maximum current of −22 mA. Resistance RL and negative supply voltage V1 must be recalculated only if there is a possibility of a rewiring and thus also a change in the resistance value due to a restart or wire breakage.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:
1. A circuit for an I/O module, the circuit comprising:
a communication unit for receiving process data, which is connectable to a bus for communication purposes;
a microcontroller which is connected to the communication unit;
a load;
a digital/analog converter, which includes a current output driver for outputting an output current to the load; and
a first DC/DC converter,
wherein the microcontroller is connected to the digital/analog converter via a digital interface,
wherein the microcontroller is configured to set the output current of the digital/analog converter via the digital interface based on the received process data,
wherein the digital/analog converter includes an analog/digital converter and is configured to convert an output voltage into a digital voltage value with the aid of the analog/digital converter and to transmit it to the microcontroller via the digital interface,
wherein the microcontroller is connected to the first DC/DC converter via a control interface,
wherein the first DC/DC converter is configured to generate a first supply voltage for supplying the current output driver of the digital/analog converter, and
wherein the microcontroller is configured to output a control signal to the first DC/DC converter via the control interface for setting the first supply voltage based on the output current and the digital voltage value.

2. The circuit according to claim 1, wherein the microcontroller is further configured to store an output range having a minimum current value and a maximum current value received via the communication unit and to set the first supply voltage based on the minimum current value and/or the maximum current value.

3. The circuit according to claim 1, wherein the microcontroller is configured to initially set the first supply voltage to a maximum voltage value and, after the process data is received, to set the first supply voltage based on the output current and the digital voltage value.

4. The circuit according to claim 1, wherein the microcontroller is further configured to set the first supply voltage based on the output current if the output current contained in the process data is within a predetermined current range.

5. The circuit according to claim 1, wherein the microcontroller is further configured to set the first supply voltage based on the output current if the digital voltage value is within a predetermined voltage value range.

6. The circuit according to claim 1, wherein the microcontroller is further configured to set the first supply voltage based on a function, the function including a/the maximum current value and the output current and the digital voltage value as input variables.

7. The circuit according to claim 1, wherein the microcontroller is further configured to set the first supply voltage based on a function, the function being:

$$V1 = Imax \cdot Vdig/I + Voff$$

wherein Imax is the maximum current value, V1 is the first supply voltage, Vdig is the digital voltage value, I is the output current and Voff is an offset voltage.

8. The circuit according to claim 1, wherein the microcontroller is further configured to additionally set the first supply voltage based on an offset voltage and to adapt the offset voltage as a function of time values and/or measured values.

9. The circuit according to claim 1, wherein the microcontroller is configured to determine a control signal multiple times for setting the first supply voltage and to output it to the first DC/DC converter via the control interface, the determinations taking place during two measurements of the supply voltage spaced apart in time.

10. The circuit according to claim 1, wherein the microcontroller is further configured to redetermine the first supply voltage of the first DC/DC converter upon activating the circuit.

11. The circuit according to claim 1, wherein the microcontroller is further configured to generate a control signal, by means of which the first DC/DC converter is controlled; and/or wherein the microcontroller is further configured to set the first supply voltage by means of pulse-width modulation of the control signal.

12. The circuit according to claim 1, further comprising:
a second DC/DC converter (440), which is supplied with a second supply voltage, wherein the second DC/DC converter is integrated into the digital/analog converter and is configured to generate a third supply voltage of the current output driver, and wherein the microcontroller is configured to set the third supply voltage via the digital interface based on the voltage at the current output and the output current.

13. The circuit according to claim 1, wherein the microcontroller and the first DC/DC converter are galvanically isolated.

14. The circuit according to claim 1, wherein the microcontroller and the current output driver are galvanically isolated.

15. The circuit according to claim 1, wherein the microcontroller is configured to receive process data via a bus interface and to derive current values to be output at the current output from the process data.

16. The circuit according to claim 11, wherein a memory of the microcontroller has a data structure which assigns the first supply voltage to a pulse width.

17. The circuit according to claim 12, wherein the first supply voltage is a negative voltage, and the third supply voltage is a positive voltage.

\* \* \* \* \*